United States Patent [19]

Apperson et al.

[11] Patent Number: 5,403,465
[45] Date of Patent: Apr. 4, 1995

[54] ELECTRODEPOSITED COPPER FOIL AND PROCESS FOR MAKING SAME USING ELECTROLYTE SOLUTIONS HAVING CONTROLLED ADDITIONS OF CHLORIDE IONS AND ORGANIC ADDITIVES

[75] Inventors: R. Duane Apperson, McConnelsville; Sidney J. Clouser, Chardon; Richard D. Patrick, McConnelsville, all of Ohio

[73] Assignee: Gould Inc., Eastlake, Ohio

[21] Appl. No.: 68,690

[22] Filed: May 28, 1993

Related U.S. Application Data

[63] Continuation-in-part of Ser. No. 865,791, Apr. 7, 1992, which is a continuation of Ser. No. 531,452, May 30, 1990, abandoned.

[51] Int. Cl.$^6$ .............................. C25D 1/04
[52] U.S. Cl. .................... 205/77; 205/148; 205/170; 205/101; 428/544
[58] Field of Search ............. 205/138, 148, 170, 180, 205/220, 296, 137, 77, 51; 428/544

[56] References Cited

U.S. PATENT DOCUMENTS

| | | | |
|---|---|---|---|
| 2,475,974 | 7/1949 | Max | 204/52 |
| 2,482,354 | 9/1949 | Max et al. | 204/52 |
| 2,563,360 | 8/1951 | Phillips et al. | 204/52 |
| 2,859,159 | 11/1958 | Wernlund | 204/44 |
| 2,876,178 | 3/1959 | McCoy | 204/52 |
| 3,585,010 | 6/1971 | Luce et al. | 29/191.2 |
| 3,682,788 | 8/1972 | Kardos et al. | 204/52 R |
| 3,864,227 | 2/1975 | Brytczuk et al. | 204/108 |
| 4,082,591 | 4/1978 | Morisaki et al. | 156/150 |
| 4,088,544 | 5/1978 | Hutkin | 204/12 |
| 4,169,018 | 9/1979 | Berdan et al. | 204/13 |
| 4,386,139 | 5/1983 | Nakatsugawa | 428/607 |
| 4,387,006 | 6/1983 | Kajiwara et al. | 204/32 R |
| 4,529,486 | 7/1985 | Polan | 204/216 |
| 4,686,017 | 8/1987 | Young | 204/45.1 |
| 4,834,842 | 5/1989 | Langner et al. | 204/1 T |
| 4,898,647 | 2/1990 | Luce et al. | 204/216 |
| 4,956,053 | 9/1990 | Polan et al. | 204/13 |
| 4,976,826 | 12/1990 | Tani et al. | 204/12 |
| 5,049,221 | 9/1991 | Wada et al. | 156/151 |
| 5,181,770 | 1/1993 | Brock et al. | 205/77 |

FOREIGN PATENT DOCUMENTS

| | | |
|---|---|---|
| 0250195 | 12/1987 | European Pat. Off. |
| 52-33074 | 3/1977 | Japan |
| 54-38053 | 11/1979 | Japan |
| 63-310989 | 12/1988 | Japan |
| 63-310990 | 12/1988 | Japan |
| WO91/19204 | 12/1991 | WIPO |

OTHER PUBLICATIONS

Chem Abstract, vol. 105, No. 2, Chem Abstract No. 14254j.
EPO Search Report for Application 91911599.8, mailed Feb. 9, 1993.

(List continued on next page.)

*Primary Examiner*—John Niebling
*Assistant Examiner*—Kishor Mayekar
*Attorney, Agent, or Firm*—Michael A. Centanni

[57] ABSTRACT

This invention is directed to an electrodeposited copper foil having a matte-side raw foil $R_{tm}$ of about 4 to about 10 microns, an ultimate tensile strength measured at 23° C. in the range of about 55,000 to about 80,000 psi, an elongation measured at 23° C. of about 6% to about 25%, an ultimate tensile strength measured at 180° C. in the range of about 30,000 psi to about 40,000 psi, an elongation measured at 180° C. of about 4% to about 15%, and a thermal stability of less than about −20%. The invention is also directed to a process for making the foregoing foil, the process comprising: (A) preparing an electrolyte solution comprising copper ions, sulfate ions, chloride ions at a concentration of about 1.2 to about 4.5 ppm, at least one organic additive at a concentration of about 0.4 to about 20 ppm, and at least one impurity at a concentration of about 0.01 to about 20 grams per liter; (B) flowing said electrolyte solution between an anode and a cathode, and applying an effective amount of voltage across said anode and said cathode to deposit copper on said cathode, the current density being in the range of about 0.1 to about 3 A/cm$^2$; and (C) removing copper foil from said cathode.

29 Claims, 1 Drawing Sheet

OTHER PUBLICATIONS

Lowenheim, "Modern Electroplating", Third Edition, 1974, pp. 196–197.

Bucci et al, "Copper Foil Technology," PC FAB, Jul., 1986, pp. 22–33.

Anderson et al, "Tensile Properties of Acid Copper Electrodeposits," Journal of Applied Electrochemistry 15, (1985), pp. 631–637.

Lakshmanan et al, "The Effect of Chloride Ion in the Electrowinning of Copper," Journal of Applied Electrochemistry 7 (1977), pp. 81–90.

Lamb et al, "Physical and Mechanical Properties of Electrodeposited Copper III–Deposits From Sulfate, Fluoborate, Pyrophosphate, Cyanide, and Amine Baths," Journal of the Electrochemical Society, Sep., 1970, pp. 291C–318C.

Lamb et al, "Physical and Mechanical Properties of Electrodeposited Copper—II. The Sulfate Bath,", Jan. 1966, pp. 86–95.

Lamb et al, "Physical and Mechanical Properties of Electrodeposited Copper—I. Literature Survey," Plating, Dec. 1965, pp. 1289–1311.

N. P. Fedot'ev, P. M. Vyacheslaovov et al, The Tensile Strength and Microhardness of Electrodeposited Copper, J. Applied Chem. (USSR), 37,691 (1964).

D. M. Lyde, "Copper Pyrophosphate Plating," Metal Industry (London), 101, 82 (1962).

G. W. Jernstedt, Leveling With PR Current Plating, Proc. Am. Electroplaters' Soc., 37, 151 (1950).

C. E. Heussner et al, "Some Metallurgical Aspects of Electrodeposits, Plating", 35, 554, 719 (1948).

G. W. Jernstedt, Brightener Finishes via PR Plating, Westinghouse Engr., 10, No. 3, 139 (1943).

C. W. Bennett, Tensile Strength of Electrolytic Copper on a Rotating Cathode, Trans. Am. Electrochem. Soc., 21, 253 (1912).

Wen, C. Y. et al, "The Effect of Organic and Inorganic 'Addition Agents' Upon the Electrodeposition of Copper From Electrolytes Containing Arsenic," Advance copy from the General Meeting of the American Electrochemical Society, Sep. 21–23, 1911.

+ $R_{tm}$ (µ)
□ PEEL STRENGTH (lb./in.)

ELECTRODEPOSITED COPPER FOIL AND PROCESS FOR MAKING SAME USING ELECTROLYTE SOLUTIONS HAVING CONTROLLED ADDITIONS OF CHLORIDE IONS AND ORGANIC ADDITIVES

This application is a continuation-in-part of U.S. application Ser. No. 07/865,791, filed Apr. 7, 1992, which is a continuation of U.S. application Ser. No. 07/531,452, filed May 30, 1990 (now abandoned). The disclosures of these prior applications are incorporated herein by reference in their entireties.

TECHNICAL FIELD

This invention relates to electrodeposited copper foils which are useful in making printed circuit boards (PCBs), and to a process for making such foils. The foils are characterized by a unique combination of properties, namely, matte-side raw foil $R_{tm}$ of about 4 to about 10 microns, an ultimate tensile strength measured at 23° C. in the range of about 55,000 to about 80,000 psi, an elongation measured at 23° C. of about 6% to about 25%, an ultimate tensile strength measured at 180° C. in the range of about 30,000 psi to about 40,000 psi, an elongation measured at 180° C. of about 4% to about 15%, and a thermal stability of less than about −20%. The process involves the use of an electrolyte solution having a chloride ion concentration in the range of about 1.2 to about 4.5 ppm, an organic additive concentration in the range of about 0.4 to about 20 ppm, at least one impurity at a concentration in the range of about 0.01 to about 20 grams per liter, and a current density in the range of about 0.1 to about 3 A/cm$^2$.

BACKGROUND OF THE INVENTION

Copper foil is supplied to PCB manufacturers in the form of laminates. These laminates are formed by bonding the copper foil to a polymeric insulating resin. The copper foil portion of the laminate is etched to form the conductive paths of the PCB using processes known to those skilled in the art. The etched copper conductive paths provide electrical connection between various portions of an electronic device.

The copper foil qualities that enable improved performance and reliability are lower controlled profile (roughness), superior ductility, high tensile strength, and thermal stability. The prior art suggests methods of making copper foils having one or more of these attributes, but not all of them simultaneously.

All of these attributes are essential for providing copper foils that are fully acceptable to the PCB industry. For example, foils having profiles that are too high result in laminates exhibiting glass fiber breakage, measles and embedded copper. Foils having profiles that are too low result in laminates with insufficient bond strength. Foils with low ductilities crack when temperature stressed. Thermally unstable foils result in laminates that warp and twist when copper recrystallizes and softens during heating. Foils with low tensile strengths wrinkle during handling. The foils of the present invention overcome all of these problems.

The trend in the PCB industry is to use thinner laminates made with thinner foils and less resin. These laminates are often processed at higher temperatures than heretofore. Additionally, the industry is being required to hold ever tighter tolerances. To meet these challenges the industry is desirous of having thinner foils with low profile and good bonding characteristics. These foils must have a minimum of about 4% elongation at 180° C. for ductility and must be thermally stable. The foils must have tensile strengths high enough to resist damage during handling.

Copper foil producers are desirous of having a process for the manufacture of these foils that is highly tolerant of impurities that are routinely present in copper electrolytes. The difficulties and expenses associated with providing essentially pure electrolytes render processes requiring such electrolytes non-competitive.

Lakshmanan et al, "The Effect of Chloride Ion in the Electrowinning of Copper", Journal of Applied Electrochemistry 7 (1977) 81–90, discloses that the effect of chloride ion concentration on copper electrodeposition is dependent on the operating current density. At lower current density values the ridge type growth structure orientation is favored for additive-free electrolytes. At high current density values pyramidal growth orientation is favored for additive-free electrolytes. The addition of chloride ion to the 10 ppm level lowers the overvoltage and thus promotes ridge type oriented deposits. As the current density is increased to 40 amps per square foot [0.043 A/cm$^2$], the pyramidal growth structure is again favored. The article indicates that the current densities that were tested ranged from 15 to 40 amps per square foot [0.016 to 0.043 A/cm$^2$].

Anderson et al, "Tensile Properties of Acid Copper Electrodeposits", Journal of Applied Electrochemistry, 15 (1985) 631–637, discloses that the chloride ion concentration in an acid copper plating bath influences the ultimate tensile strength and elongation of the foil produced therefrom. The article indicates that at the current densities tested, acid copper plating baths require the presence of chloride ions to provide a ductile copper deposit. The current densities reported in the article ranged from 20 to 50 mA/cm$^2$ [0.02 to 0.05, A/cm$^2$]. Chloride ion concentrations in the range of 0 to 100 ppm are reported.

U.S. Pat. No. 2,475,974 discloses a process for making copper deposits having tensile strengths of about 60,000 to about 73,000 psi and elongations of 6% to 9% using a copper plating solution containing triethanolamine.

U.S. Pat. No. 2,482,354 discloses a process for making copper deposits having tensile strengths of about 65,000 to about 90,000 psi and elongations of 8% to 12% using a copper plating solution containing tri-isopropanolamine.

U.S. Pat. No. 4,956,053 discloses an electrodeposition process for making copper foil using an additive-free electrolyte solution. The reference indicates that the "impurities, especially organics, sulfides and chlorides are kept in concentrations of less than about 5 parts per million and preferably less than about 1 part per million and most preferably at the limits of detection, in the range of parts per billion" (col. 8, lines 8–12). The disclosed process includes a filtration and replenishment system to maintain the electrolyte impurity and particulate free.

U.S. Pat. No. 5,181,770 discloses an electrodeposition process for making copper foil using an electrolyte solution having a chloride ion concentration of either 0.5–2.5 ppm or 10–50 ppm. The reference indicates that all organic and inorganic additives as well as impurities are excluded from the electrolyte.

WO 91/19024 discloses electrodeposited copper foils having an elongation measured at 180° C. in excess of about 5.5%, an ultimate tensile strength measured at 23°

C. in excess of about 60,000 psi, and a matte-side $R_{tm}$ in the range of about 4.5 to about 18 μm. This reference also discloses a process for making electrodeposited copper foil which comprises: preparing a copper deposition bath comprising water, copper ions and sulfate ions, said bath containing less than about 20 ppm chloride ions; and applying electric current to said bath to electrodeposit copper from said bath using a current density in the range of about 200 to about 3000 amps per square foot [0.22–3.23 $A/cm^2$].

SUMMARY OF THE INVENTION

This invention is directed to an electrodeposited copper foil having a matte-side raw foil $R_{tm}$ of about 4 to about 10 microns, an ultimate tensile strength measured at 23° C. in the range of about 55,000 to about 80,000 psi, an elongation measured at 23° C. of about 6% to about 25%, an ultimate tensile strength measured at 180° C. in the range of about 30,000 psi to about 40,000 psi, an elongation measured at 180° C. of about 4% to about 15%, and a thermal stability of less than about −20%. The invention is also directed to a process for making the foregoing foil, the process comprising: (A) preparing an electrolyte solution comprising copper ions, sulfate ions, chloride ions at a concentration of about 1.2 to about 4.5 ppm, at least one organic additive at a concentration of about 0.4 to about 20 ppm, and metal-containing impurities at a concentration of about 0.01 to about 20 grams per liter; (B) flowing said electrolyte solution between an anode and a cathode, and applying an effective amount of voltage across said anode and said cathode to deposit copper on said cathode, the current density being in the range of about 0.1 to about 3 $A/cm^2$; and (C) removing copper foil from said cathode.

DESCRIPTION OF THE PREFERRED EMBODIMENTS

Figure 1:
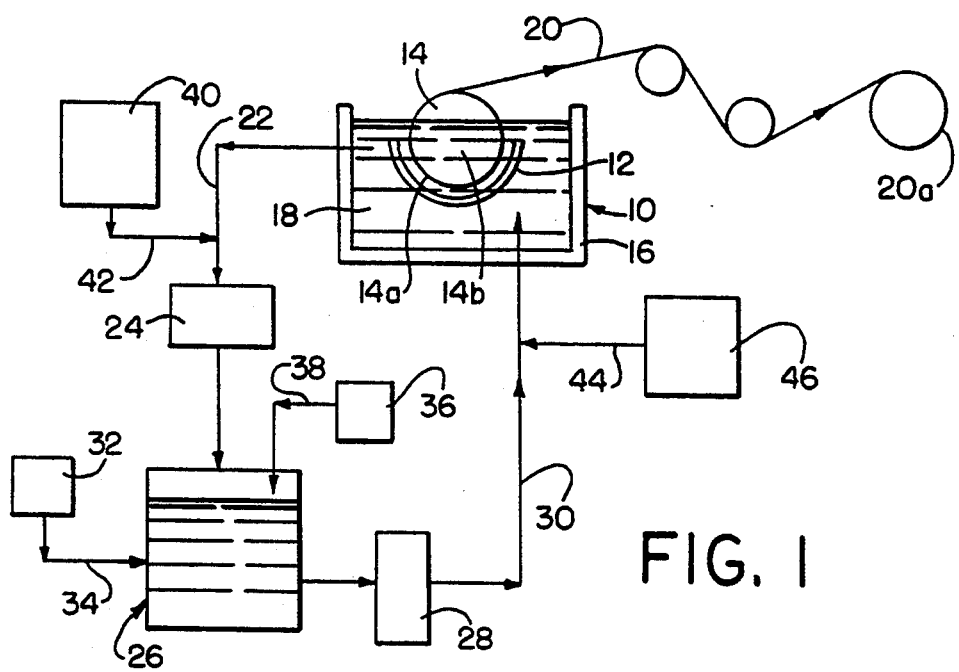
FIG. 1 is a flow sheet illustrating the process of the invention in a preferred embodiment.

The inventive copper foils exhibit a unique and novel combination of properties. These include high-tensile strength, superior ductility, thermal stability, and lower controlled profile (roughness). This novel combination of properties is achieved by virtue of the inventive process for making copper foil which involves the use of an electrolyte solution employing critical concentrations of: (1) chloride ions at a level of about 1.2 to about 4.5 ppm; and (2) organic additives at a level of about 0.4 to about 20 ppm. Unexpectedly, the inventive process is highly tolerant to impurities which are routinely present in copper electrolytes, and, in fact, with the inventive process it is preferred to have such impurities present at concentrations in the range of about 0.01 to about 20 grams per liter.

The Copper Foil

The ultimate tensile strength (UTS) for the inventive copper foils at 23° C. is preferably in the range of about 55,000 psi to about 80,000 psi, and in one embodiment about 60,000 psi to about 80,000 psi, and in another embodiment about 65,000 psi to about 80,000 psi, and in another embodiment about 70,000 to about 80,000 psi, and in still another embodiment about 72,000 to about 80,000 psi, using Test Method 2.4.18 of IPC-TM-650.

The UTS for these foils at 180° C. is preferably in range of about 30,000 psi to about 40,000 psi, and in one embodiment about 32,000 psi to about 38,000 psi using the foregoing test method.

The elongation for these foils at 23° C. is preferably about 10% to about 20% using Test Method 2.4.18 of IPC-TM-650. The elongation of these foils at 180° C. is preferably about 4% to about 15%, more preferably about 6% to about 10% using the foregoing test method.

The term "thermal stability" is used herein to refer to the change in UTS at 23° C. after heating the foil sample at 225° C. for 30 minutes in an air oven. The thermal stability for these foils is preferably less than about −20%, and in one embodiment less than about −18%. That is, a thermally stable foil within the scope of the invention undergoes a decrease in UTS at 23° C. of preferably less than about 20%, and in one embodiment less than about 18%, when compared to the UTS for that foil prior to heating the sample.

The inventive copper foils preferably have matte-side raw foil roughnesses, $R_{tm}$, of about 4 to about 10 microns. $R_{tm}$ is the mean of the maximum peak-to-valley vertical extents from each of five consecutive sampling lengths, and can be measured using a Surftronic 3 profilometer marketed by Rank Taylor Hobson, Ltd., Leicester, England.

The $R_{tm}$ for the shiny side of these foils is preferably less than about 6 microns, more preferably less than about 5 microns, and is preferably in the range of about 2 to about 6 microns, more preferably in the range of about 2 to about 5 microns.

The inventive copper foils preferably have weights in the range of about ⅛ to about 14 ounces per square foot, more preferably about ¼ to about 6 ounces per square foot, more preferably about ½ to about 2 ounces per square foot. In preferred embodiments, these foils have weights of about ½, 1 or 2 ounces per square foot. A foil having a weight of ½ ounce per square foot has a nominal thickness of 17 microns. A foil having a weight of 1 ounce per square foot has a nominal thickness of 35 microns. A foil having a weight of 2 ounces per square foot has a nominal thickness of 70 microns.

In one embodiment, the foil has a weight of about ½ ounce per square foot, a matte-side raw foil $R_{tm}$ of about 4 to about 7 microns, an ultimate tensile strength measured at 23° C. in the range of about 65,000 to about 80,000 psi, an elongation measured at 23° C. of about 6% to about 15%, an ultimate tensile strength measured at 180° C. in the range of about 32,000 psi to about 38,000 psi, an elongation measured at 180° C. of about 4% to about 10%, and a thermal stability less than about −20%.

In one embodiment, the foil has a weight of about 1 ounce per square foot, a matte-side raw foil $R_{tm}$ of about 4 to about 8 microns, an ultimate tensile strength measured at 23° C. in the range of about 63,000 to about 75,000 psi, an elongation measured at 23° C. of about 12% to about 18%, an ultimate tensile strength measured at 180° C. in the range of about 30,000 psi to about 37,000 psi, an elongation measured at 180° C. of about 6% to about 12%, and a thermal stability less than about −20%.

In one embodiment, the foil has a weight of about 2 ounces per square foot, a matte-side raw foil $R_{tm}$ of about 6 to about 10 microns, an ultimate tensile strength measured at 23° C. in the range of about 55,000 to about 70,000 psi, an elongation measured at 23° C. of about 16% to about 25%, an ultimate tensile strength measured at 180° C. in the range of about 30,000 psi to about 36,000 psi, an elongation measured at 180° C. of about 8% to about 14%, and a thermal stability less than about −20%.

The terms "untreated" and "raw" are used herein to refer to a base foil that has not undergone subsequent treatment for the purpose of refining or enhancing the foil properties. The term "treated" is used herein to refer to raw or base foil that has undergone such treatment. This treatment is entirely conventional and typically involves the use of various treating and rinsing solutions. In one embodiment, the raw or base foil has at least one roughened layer of copper or copper oxide applied to at least one side of the foil.

In one embodiment, the raw or base foil has at least one metallic or barrier layer applied to at least one side of the foil. The metal in this metallic layer is selected from the group consisting of indium, zinc, tin, nickel, cobalt, copper-zinc alloy and copper-tin alloy.

In one embodiment, the raw or base foil has at least one metallic or stabilization layer applied to at least one side of the foil. The metal in this metallic layer is selected from the group consisting of tin, chromium, and chromium-zinc alloy.

In one embodiment, the raw or base foil has at least one first metallic or barrier layer applied to at least one side of the foil, the metal in the first metallic layer being selected from the group consisting of indium, zinc, tin, nickel, cobalt, copper-zinc alloy and copper-tin alloy, and at least one second metallic or stabilization layer applied to the first metallic layer, the metal in the second metallic layer being selected from the group consisting of tin, chromium, and chromium-zinc alloy.

In one embodiment, the raw or base foil has at least one roughened layer of copper or copper oxide applied to at least one side of the foil, at least one first metallic or barrier layer applied to the roughened layer, the metal in the first metallic layer being selected from the group consisting of indium, zinc, tin, nickel, cobalt, copper-zinc alloy and copper-tin alloy, and at least one second metallic or stabilization layer applied to the first metallic layer, the metal in the second metallic layer being selected from the group consisting of tin, chromium, and chromium-zinc alloy.

The inventive copper foils have a smooth or shiny (drum) side and a rough or matte (copper deposit growth front) side. These foils can be bonded to dielectric substrates to provide dimensional and structural stability thereto, and in this regard, it is preferred to bond the matte side of the electrodeposited foil to the substrate so that the shiny side of the foil faces outwardly from the laminate. Useful dielectric substrates may be prepared by impregnating woven glass reinforcement materials with partially cured resins, usually epoxy resins. These dielectric substrates are sometimes referred to as prepregs.

In preparing the laminates, it is useful for both the prepreg material and the electrodeposited copper foil to be provided in the form of long webs of material rolled up in rolls. The rolled materials are drawn off the rolls and cut into rectangular sheets. The rectangular sheets are then laid-up or assembled in stacks of assemblages. Each assemblage may comprise a prepreg sheet with a sheet of foil on either side thereof, and in each instance, the matte side of the copper foil sheet is positioned adjacent the prepreg so that the shiny sides of the sheets of foil face outwardly on each side of the assemblage.

The assemblage may be subjected to conventional laminating temperatures and pressures between the plates of laminating presses to prepare laminates comprising sandwiches of a sheet of prepreg between sheets of copper foil.

The prepregs may consist of a woven glass reinforcement fabric impregnated with a partially cured two-stage resin. By application of heat and pressure, the matte side of the copper foil is pressed tightly against the prepreg and the temperature to which the assemblage is subjected activates the resin to cause curing, that is crosslinking of the resin and thus fight bonding of the foil to the prepreg dielectric substrate. Generally speaking, the laminating operation will involve pressures in the range of from about 250 to about 750 psi, temperatures in the range of from about 175° C. to 235° C. and a laminating cycle of from about 40 minutes to about 2 hours. The finished laminate may then be utilized to prepare printed circuit boards (PCB).

A number of manufacturing methods are available for preparing PCBs from laminates. Additionally, there is a myriad of possible end use applications including radios, televisions, computers, etc., for the PCB's. These methods and end uses are known in the art.

Process for Making the Copper Foil

The inventive process involves forming an electrolyte solution and passing it between the anode and cathode of an electroforming cell. Preferably the electrolyte solution is subjected to a purification or filtering process prior to entering the electroforming cell to ensure that the electrodeposited foil contains no disruptions and/or discontinuities. When voltage is applied between the anode and cathode, electrodeposition of copper occurs at the cathode. The electric current is preferably direct current or alternating current with a direct current bias. The electrodeposited copper is removed from the cathode as a continuous thin web of foil as the cathode rotates. It can be collected in roll form. The rotating cathode preferably is in the form of a cylindrical mandrel. However, alternatively, the cathode can be in the form of a moving belt. Both of these designs are known in the art. The anode has a curved shape conforming to the curved shape of the cathode to provide a uniform gap between the anode and the cathode. This gap is preferably from about 0.3 to about 2 centimeters in length.

The velocity of the flow of the electrolyte solution through the gap between the anode and the cathode is preferably in the range of about 0.2 to about 5 meters per second, more preferably about 1 to about 3 meters per second. The electrolyte solution preferably has a free sulfuric acid concentration in the range of about 10 to about 150 grams per liter, more preferably about 80 to about 120 grams per liter. The temperature of the of the electrolyte solution in the electroforming cell is preferably in the range of about 25° C. to about 100° C., more preferably about 40° C. to about 70° C. The copper ion concentration (contained in $CuSO_4$) is preferably in the range of about 50 to about 150 grams per liter, more preferably from about 70 to about 130 grams per liter, more preferably about 90 to about 110 grams per liter. The current density is critical and is in the range of about 0.1 to about 3 amps per square centimeter, more preferably about 0.5 to about 1.8 amps per square foot.

The impurity level is in the range of about 0.01 to about 20 grams per liter, and typically in the range of about 0.5 to about 10 grams per liter. The impurities can be organic or inorganic and include nitrates, phosphates, sulfides, and the like. In one embodiment the impurity is an inorganic impurity containing one or more elements selected from the group consisting of Ag, Al, As, Ba, Bi, Ca, Cd, Co, Cr, Fe, In, K, Mg, Mn, Mo, Na, Ni, P, Pb, Sb, Se, Si, Sn, Sr, Ti, V and Zn.

The free chloride ion concentration is critical and is in the range of about 1.2 to about 4.5 ppm, or about 1.4 to about 3.9 ppm. Foils produced from electrolyte solutions having chloride concentrations above this range exhibit profiles that are unacceptably high. Foils produced from electrolytes having chloride concentrations below this range exhibit profiles that are unacceptably low. Chloride may be added as HCl, NaCl, KCl or other free chloride-containing species. A method for measuring low concentrations of chloride ion in the electrolyte solution involves the use of multiple known additions of Cl⁻ on an Orion 960 Autochemistry involves the use of multiple known additions of Cl⁻ on an Orion 960 Autochemistry System. The system has an Orion model 94-17B chloride electrode and an Orion model 90-02 double junction reference electrode. The precision of the method is 2%. The method is capable of measuring Cl⁻ concentrations below 1 ppm in the electrolyte. It may be improved by adding a known concentration of Cl⁻, for example 5 ppm, to the solution containing the unknown quantity of Cl⁻ prior to the measurements. The 5 ppm addition is then subtracted from the Cl⁻ concentration determined by the Orion 960 Autochemistry System.

It is critical that the electrolyte solution contain at least one organic additive, the concentration of said organic additive being in the range of about 0.4 to about 20 ppm, and in one embodiment from about 0.4 to about 6 ppm, and in another embodiment from about 0.5 to about 3 ppm. In one embodiment the organic additive is an active sulfur-containing compound. The term "active-sulfur containing compound" refers to compounds characterized generally as containing a bivalent sulfur atom both bonds of which are directly connected to a carbon atom together with one or more nitrogen atoms also directly connected to the carbon atom. In this group of compounds the double bond may in some cases exist or alternate between the sulfur or nitrogen atom and the carbon atom. Thiourea is a useful active sulfur-containing compound. The thioureas having the nucleus

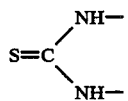

and the iso-thiocyanates having the grouping S=C=N— are useful. Thiosinamine (allyl thiourea) and thiosemicarbazide are also useful. The active sulfur-containing compound should be soluble in the electrolyte solution and be compatible with the other constituents.

In one embodiment the organic additive is one or more gelatins. The gelatins that are useful herein are heterogeneous mixtures of water-soluble proteins derived from collagen. Animal glue is a preferred gelatin.

In one embodiment the organic additive is selected from the group consisting of molasses, guar gum, the polyalkylene glycols (e.g., polyethylene glycol, polypropylene glycol, polyisopropylene glycol, etc.), dithiothreitol, amino acids (e.g., proline, hydroxyproline, cysteine, etc.), acrylamide, sulfopropyl disulfide, tetraethylthiuram disulfide, benzyl chloride, epichlorohydrin, chlorohydroxylpropyl sulfonate, alkylene oxides (e.g., ethylene oxide, propylene oxide, etc.), the sulfonium alkane sulfonates, thiocarbamoyldisulfide, or a mixture of two or more thereof.

During electrodeposition it is preferred to maintain the ratio of applied current density (I) to diffusion limited current density ($I_L$) at a level of about 0.4 or less, more preferably about 0.3 or less. That is, $I/I_L$ is preferably about 0.4 or less, more preferably about 0.3 or less. The applied current density (I) is the number of amperes applied per unit area of electrode surface. The diffusion limited current density ($I_L$) is the maximum rate at which copper can be deposited. The maximum deposition rate is limited by how fast copper ions can diffuse to the surface of the cathode to replace those depleted by previous deposition. It can be calculated by the equation $$I_L = \frac{nFDC^\circ}{\delta(1-t)}$$

The terms used in the foregoing equation and their units are defined below:

| Symbol | Description | Units |
| --- | --- | --- |
| I | Current Density | Amperes/cm² |
| $I_L$ | Diffusion Limited Current Density | Amperes/cm² |
| n | Equivalent Charge | Equivalents/mole |
| F | Faraday's Constant | 96487 (Amp)(second)/equivalent |
| C° | Bulk Cupric Ion Concentration | Mole/cm³ |
| D | Diffusion Coefficient | cm²/second |
| δ | Concentration Boundary Layer Thickness | cm |
| t | Copper transfer number | dimensionless |

The boundary layer thickness δ is a function of viscosity, diffusion coefficient, and flow velocity. In one embodiment the following parameter values are useful in electrodepositing foil:

| Parameter | Value |
| --- | --- |
| I (A/cm²) | 1.0 |
| n (eq/mole) | 2 |
| D (cm²/s) | 3.5 × 10⁻⁵ |
| C° (mole/cm³, Cu⁺² (as CuSO₄)) | 1.49 × 10⁻³ |
| Temperature (°C.) | 60 |
| Free sulfuric acid (g/l) | 90 |
| Kinematic Viscosity (cm²/s) | 0.0159 |
| Flow rate (cm/s) | 200 |

In one embodiment of the invention a continuous electrodeposition process for making copper foil is provided. A flow sheet of this process is depicted in FIG. 1. The apparatus used with this process includes an electroforming cell 10 that includes anode 12, cathode 14, vessel 16 and electrolyte solution 18. Anode 12 is submerged in electrolyte solution 18, and cathode 14 is partially submerged in electrolyte solution 18.

Electrical means that are well known in the art are provided for applying a voltage between anode 12 and cathode 14. The current is preferably direct current or alternating current with a direct current bias. Copper ions in solution 18 gain electrons at the peripheral surface 14a of cathode 14 whereby metallic copper plates out in the form of a foil layer 20. Cathode 14 rotates continuously about its axis 14b during the process and foil layer 20 is continuously withdrawn from surface 14a as a continuous web which is formed into a roll 20a.

The process depletes the electrolyte solution of copper ions and organic additives. These ingredients are continuously replenished. Electrolyte solution 18 is withdrawn through line 22 and recirculated through filter 24, digester 26 and filter 28, and then is reintroduced into vessel 16 through line 30. Sulfuric acid from a source 32 is advanced to digester 26 through line 34. Copper from a source 36 is introduced into digester 26 along path 38. In one embodiment the metallic copper is in the form of copper shot, copper wire, copper oxide or recycled copper. The copper is dissolved by the sulfuric acid and air to form copper ions in digester 26.

Organic additives are added to the recirculating solution in line 22 from a source 40 through line 42. Preferably, active sulfur-containing material is added to the recirculating solution in line 30 through line 44 from a source 46. The addition rate for these organic additives is preferably in the range of about 0.1 to about 14 mg/min/kA, and in one embodiment from about 0.2 to about 6 mg/min/kA, and in another embodiment from about 1.5 to about 2.5 mg/min/kA.

The following examples are provided for purposes of illustrating the invention. Unless otherwise indicated, in the following example as well as throughout the specification and claims, all parts and percentages are by weight, all temperatures are in degrees centigrade, and all pressures are atmospheric.

EXAMPLE 1

Electrodeposition of copper foil is carried out using the electrolyte solution indicated below. The organic additive is animal glue. The electrodeposition conditions are indicated below.

| Parameter | Units | Value |
| --- | --- | --- |
| $Cu^{+2}$ (in $CuSO_4$) | g/l | 95–115 |
| Sulfuric acid (free) | g/l | 50–70 |
| Chloride ion (free) | ppm | 1.4–3.9 |
| Temperature | °C. | 62–66 |
| Current Density | $A/cm^2$ | 0.78–0.98 |
| Organic Additive addition rate | mg/min/kA | 1.9–2.1 |
| Impurities* | g/l | 0.5–0.9 |
| Flow velocity | m/s | 1.5–1.8 |

*Impurities include species containing Al, As, Ca, Cd, Co, Cr, Fe, K, Na, Ni, Pb, Sb, Si, Sn, Zn.

Figure 2:
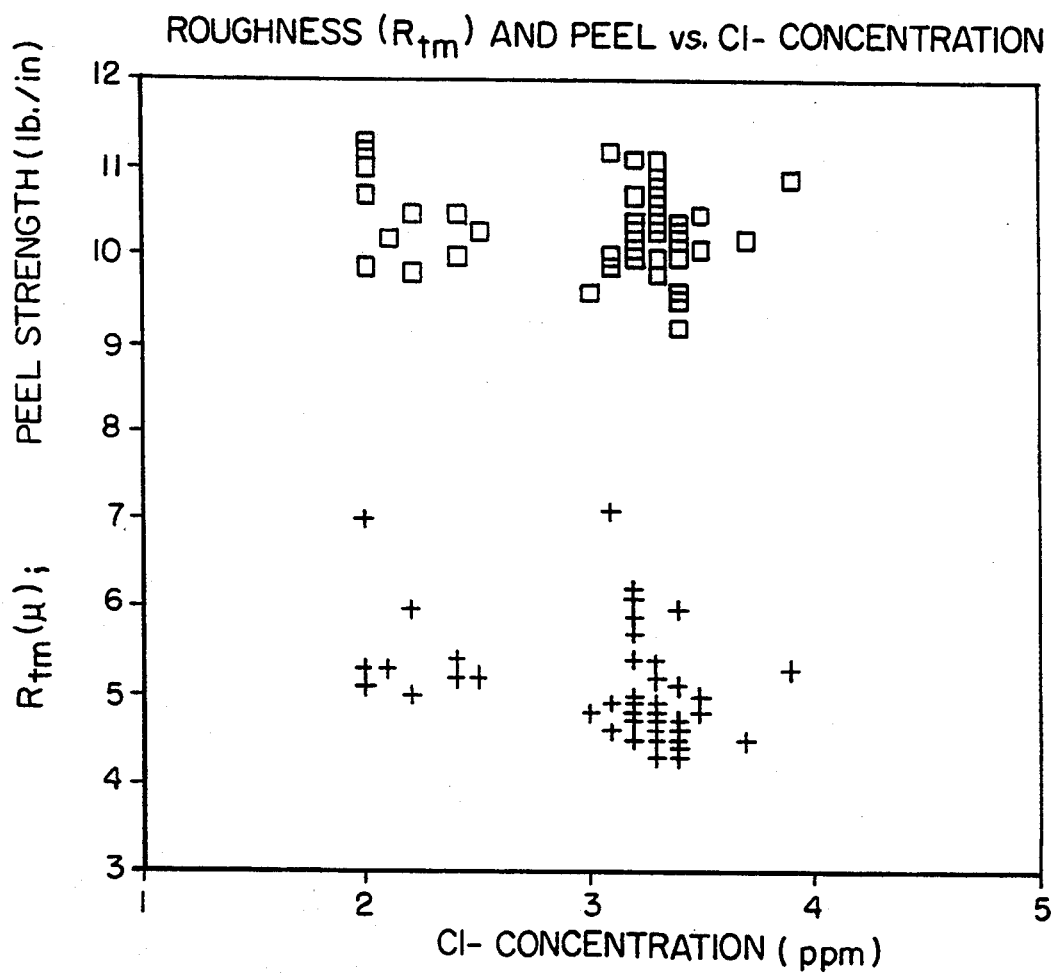
FIG. 2 is a chart disclosing results produced in Example 2.

FIG. 2 shows raw foil roughness ($R_{tm}$) and treated foil peel strength as a function of $Cl^-$ concentration in the electrolyte solution for a 35 micron nominal thickness foil. The treated foils have applied to their matte side a copper oxide roughening layer, a brass barrier layer overlying the roughening layer, and a zinc-chrome stabilization layer overlying the barrier layer. The shiny side of these foils has a zinc-chrome stabilization layer applied thereto. The peel strengths for these foils are measured on the matte side and are greater than 9 lb/in upon lamination to glass/difunctional epoxy resin substrates.

EXAMPLE 2

Electrodeposition of copper foil is carried out using the electrolyte solution indicated below. The organic additive is animal glue. The electrodeposition operating conditions are indicated below. Copper foils of nominal 17, 35 and 70 micron thicknesses are electrodeposited.

| Parameter | Units | Value |
| --- | --- | --- |
| $Cu^{+2}$ (in $CuSO_4$) | g/l | 95–115 |
| Sulfuric acid (free) | g/l | 50–70 |
| Chloride ion (free) | ppm | 1.4–3.9 |
| Temperature | °C. | 62–66 |
| Current Density | $A/cm^2$ | 0.78–0.98 |
| Organic Additive addition rate | mg/min/kA | 1.9–2.1 |
| Impurities* | g/l | 0.5–0.9 |
| Flow velocity | m/s | 1.5–1.8 |

*Impurities include species containing Al, As, Ca, Cd, Co, Cr, Fe, K, Na, Ni, Pb, Sb, Si, Sn, Zn.

The attributes of these copper foils are:

| Attribute | Units | Value 17µ | 35µ | 70µ |
| --- | --- | --- | --- | --- |
| UTS at 23° C. | psi | 74,000 | 69,000 | 65,000 |
| Elongation at 23° C. | % | 11 | 15 | 19 |
| UTS at 180° C. | psi | 34,000 | 34,000 | 34,000 |
| Elongation at 180° C. | % | 6 | 8 | 10 |
| Matte surface roughness, $R_{tm}$ | µ | 4.6 | 5.2 | 7.7 |
| Thermal stability* | % | −16 | −13 | — |

*Thermal stability defined as the change in UTS at 23° C. upon heating at 225° C. for 30 minutes in an air oven.

EXAMPLE 3

Electrodeposition of copper foil is carried out using the electrolyte solution indicated below. The organic additive is animal glue. The operating conditions are indicated below.

| Parameter | Units | Value |
| --- | --- | --- |
| $Cu^{+2}$ (in $CuSO_4$) | g/l | 110–115 |
| Sulfuric acid (free) | g/l | 70 |
| Chloride ion (free) | ppm | 2.7 |
| Temperature | °C. | 65 |
| Current Density | $A/cm^2$ | 1.08 |
| Organic Additive addition rate | mg/min/kA | 4.5 |
| Impurities* | g/l | 0.1 |
| Flow velocity | m/s | 1.8 |

*Impurities include species containing Al, As, Ca, Cd, Co, Cr, Fe, K, Na, Ni, Pb, Sb, Si, Sn, Zn.

The foil is heat-treated at 225° C. for 30 minutes. The foil shows no grain growth upon heat treatment. Its thermal stability is −17%.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

We claim:

1. An electrodeposited copper foil having a matte-side raw foil roughness $R_{tm}$ of about 4 to about 10 microns, an ultimate tensile strength measured at 23° C. in the range of about 65,000 to about 80,000 psi, an elongation measured at 23° C. of about 6% to about 25%, an ultimate tensile strength measured at 180° C. in the range of about 30,000 psi to about 40,000 psi, an elongation measured at 180° C. of about 4% to about 15%, and a thermal stability less than about −20%.

2. The foil of claim 1 having said matte-side raw foil $R_{tm}$ of about 4 to about 7 microns, said ultimate tensile strength measured at 23° C. in the range of about 65,000 to about 80,000 psi, said elongation measured at 23° C. of about 6% to about 15%, said ultimate tensile strength measured at 180° C. in the range of about 32,000 psi to about 38,000 psi, and said elongation measured at 180° C. of about 4% to about 10%, and further having a weight of about ½ ounce per square foot.

3. The foil of claim 1 having said a matte-side raw foil $R_{tm}$ of about 4 to about 8 microns, said ultimate tensile strength measured at 23° C. in the range of about 65,000 to about 75,000 psi, said elongation measured at 23° C. of about 12% to about 18%, said ultimate tensile strength measured at 180° C. in the range of about 30,000 psi to about 37,000 psi, and said elongation measured at 180° C. of about 6% to about 12%, and further having a weight of about 1 ounce per square foot.

4. The foil of claim 1 having said matte-side raw foil $R_{tm}$ of about 6 to about 10 microns, said ultimate tensile strength measured at 23° C. in the range of about 65,000 to about 70,000 psi, said elongation measured at 23° C. of about 16% to about 25%, said ultimate tensile strength measured at 180° C. in the range of about 30,000 psi to about 36,000 psi, and said elongation measured at 180° C. of about 8% to about 14%, and further having a weight of about 2 ounce per square foot.

5. The foil of claim 1 further having at least one roughened layer of copper or copper oxide applied to at least one side of said foil.

6. The foil of claim 1 further having at least one metallic layer applied to at least one side of said foil, the metal in said metallic layer being selected from the group consisting of indium, zinc, tin, nickel, cobalt, copper-zinc alloy and copper-tin alloy.

7. The foil of claim 1 further having at least one metallic layer applied to at least one side of said foil, the metal in said metallic layer being selected from the group consisting of chromium, and chromium-zinc alloy.

8. The foil of claim 1 further having at least one first metallic layer applied to at least one side of said foil, the metal in said first metallic layer being selected from the group consisting of indium, zinc, tin, nickel, cobalt, copper-zinc alloy and copper-tin alloy, and at least one second metallic layer applied to said first metallic layer, the metal in said second metallic layer being selected from the group consisting of tin, chromium, and chromium-zinc alloy.

9. The foil of claim 1 further having at least one roughened layer of copper or copper oxide applied to at least one side of said foil, at least one first metallic layer applied to said roughened layer, the metal in said first metallic layer being selected from the group consisting of indium, zinc, tin, nickel, cobalt, copper-zinc alloy and copper-tin alloy, and at least one second metallic layer applied to said first metallic layer, the metal in said second metallic layer being selected from the group consisting of tin, chromium, and chromium-zinc alloy.

10. A laminate comprising at least one copper foil adhered to a dielectric substrate, said copper foil having a matte-side raw foil roughness $R_{tm}$ of about 4 to about 10 microns, an ultimate tensile strength measured at 23° C. in the range of about 65,000 to about 80,000 psi, an elongation measured at 23° C. of about 6% to about 25%, an ultimate tensile strength measured at 180° C. in the range of about 30,000 psi to about 40,000 psi, an elongation measured at 180° C. of about 4% to about 15%, and a thermal stability less than about −20%.

11. A process for making electrodeposited copper foil comprising:

(A) preparing an electrolyte solution comprising copper ions, sulfate ions, chloride ions at a concentration of about 1.2 to about 4.5 ppm, an organic additive at a concentration of about 0.4 to about 20 ppm, and an impurity at a concentration of about 0.01 to about 20 grams per liter;

(B) flowing said electrolyte solution between an anode and a rotating cathode, applying an effective amount of voltage across said anode and said cathode to provide an electric current between said anode and said cathode having a current density in the range of about 0.1 to about 3 A/cm$^2$, and depositing copper on said cathode; and (C) continuously removing deposited copper from said cathode as a thin web of copper foil; wherein said copper foil has a matte-side raw foil roughness $R_{tm}$ of about 4 to about 10 microns, an ultimate tensile strength at 23° C. in the range of about 65,000 to about 80,000 psi, an elongation measured at 23° C. of about 6 to about 25%, an ultimate tensile strength measured at 180° C. in the range of about 30,000 to about 40,000 psi, an elongation measured at 180° C. of about 4 to about 15%, and a thermal stability less than about −20%.

12. The process of claim 11 wherein said organic additive is gelatin.

13. The process of claim 11 wherein said organic additive is animal glue.

14. The process of claim 11 wherein said organic additive is active-sulfur containing material.

15. The process of claim 11 wherein said organic additive is thiourea.

16. The process of claim 11 wherein said organic additive is selected from the group consisting of molasses, guar gum, polyethylene glycol, polypropylene glycol, polyisopropylene glycol, dithiothreitol, proline, hydroxyproline, cysteine, acrylamide, sulfopropyl disulfide, tetraethylthiuram disulfide, benzyl chloride, epichlorohydrin, chlorohydroxylpropylsulfonate, ethylene oxide, propylene oxide, sulfonium alkane sulfonate, thiocarbamoyldisulfide, and mixtures of two or more thereof.

17. The process of claim 11 wherein said impurity is an inorganic impurity containing one or more elements selected from the group consisting of Ag, Al, As, Ba, Bi, Ca, Cd, Co, Cr, Fe, In, K, Mg, Mn, Mo, Na, Ni, P, Pb, Sb, Se, Si, Sn, Sr, Ti, V and Zn.

18. The process of claim 11 wherein said electrolyte solution has a copper ion concentration in the range of about 50 to about 150 grams per liter and a free sulfuric acid concentration in the range of about 10 to about 150 grams per liter.

19. The process of claim 11 wherein the ratio of said current density to the diffusion limited current density during step (B) is about 0.4 or less.

20. The process of claim 11 wherein the current density during step (B) is from about 0.5 to about 1.8 A/cm$^2$.

21. The process of claim 11 wherein said electrolyte solution during step (B) has a temperature of about 25° C. to about 100° C.

22. The process of claim 11 wherein said flowing of said electrolyte solution between said anode and said cathode during step (B) is at a rate of from about 0.2 to about 5 meters per second.

23. The process of claim 11 further comprising the step of applying to at least one side of said foil at least one roughened layer of copper or copper oxide.

24. The process of claim 11 further comprising the step of applying to at least one side of said foil at least one metallic layer, the metal in said metallic layer being selected from the group consisting of indium, zinc, tin, nickel, cobalt, copper-zinc alloy and copper-tin alloy.

25. The process of claim 11 further comprising the step of applying to at least one side of said foil at least one metallic layer, the metal in said metallic layer being selected from the group consisting of tin, chromium, and chromium-zinc alloy.

26. The process of claim 11 further comprising the steps of applying to at least one side of said foil at least one first metallic layer, the metal in said first metallic layer being selected from the group consisting of indium, zinc, tin, nickel, cobalt, copper-zinc alloy and copper-tin alloy, then applying to said first metallic layer at least one second metallic layer, the metal in said second metallic layer being selected from the group consisting of tin, chromium, and chromium-zinc alloy.

27. The process of claim 11 further comprising the steps of applying to at least one side of said foil at least one roughened layer of copper or copper oxide, then applying to said roughened layer at least one first metallic layer, the metal in said first metallic layer being selected from the group consisting of indium, zinc, tin, nickel, cobalt, copper-zinc alloy and copper-tin alloy, then applying to said first metallic layer at least one second metallic layer, the metal in said second metallic layer being selected from the group consisting of tin, chromium, and chromium-zinc alloy.

28. A process for making a copper foil comprising:
(A) preparing an electrolyte solution comprising copper ions, sulfate ions, chloride ions at a concentration of about 1.4 to about 3.9 ppm, about 0.6 to about 20 ppm of animal glue, and an impurity at a concentration of about 0.01 to about 20 grams per liter;
(B) flowing said electrolyte solution between an anode and a rotating cathode, applying an effective amount of voltage across said anode and said cathode to provide an electric current between said anode and said cathode having a current density in the range of about 0.5 to about 1.8 A/cm$^2$, the ratio of said current density to the diffusion limited current density being about 0.4 or less, and depositing copper on said cathode; and
(C) continuously removing deposited copper from said cathode as a thin web of copper foil; wherein said cooper foil has a matte-side raw foil roughness $R_{tm}$ of about 4 to about 10 microns, an ultimate tensile strength at 23° C. in the range of about 65,000 to about 80,000 psi, an elongation measured at 23° C. of about 6 to about 25%, an ultimate tensile strength measured at 180° C. in the range of about 30,000 to about 40,000 psi, an elongation measured at 180° C. of about 4 to about 15%, and a thermal stability less than about −20%.

29. A process for making a copper foil comprising:
(A) preparing an electrolyte solution comprising copper ions, sulfate ions, chloride ions at a concentration of about 1.2 to about 4.5 ppm, an organic additive at a concentration of about 0.6 to about 20 ppm, and an impurity at a concentration of about 0.01 to about 20 grams per liter;
(B) flowing said electrolyte solution between an anode and a rotating cathode, applying an effective amount of voltage across said anode and said cathode to provide an electric current between said anode and said cathode having a current density in the range of about 0.1 to about 3A/cm$^2$, and depositing copper on said cathode;
(C) continuously removing deposited copper from said cathode as a thin web of copper foil; wherein said copper foil has a matte-side raw foil roughness $R_{tm}$ of about 4 to about 10 microns, an ultimate tensile strength at 23° C. in the range of about 65,000 to about 80,000 psi, an elongation measured at 23° C. of about 6 to about 25%, an ultimate tensile strength measured at 180° C. in the range of about 30,000 to about 40,000 psi, an elongation measured at 180° C. of about 4 to about 15%, and a thermal stability less than about −20%; and
(D) adding copper ions and additional amounts of said organic additive to said electrolyte solution, the rate at which said organic additive is added being about 0.1 to about 14 mg/min/kA.

* * * * *